United States Patent [19]
Suzuki

[11] Patent Number: 5,763,942
[45] Date of Patent: Jun. 9, 1998

[54] LEAD FRAME FREE OF IRREGULAR DEFORMATION

[75] Inventor: Yasuhiro Suzuki, Tokyo, Japan

[73] Assignee: NEC Corporation, Tokyo, Japan

[21] Appl. No.: 800,297

[22] Filed: Feb. 13, 1997

[51] Int. Cl.$^6$ .................................................. H01L 23/495
[52] U.S. Cl. ........................ 257/669; 257/670; 257/667
[58] Field of Search ............................. 257/666, 667, 257/669, 670, 674

[56] References Cited

U.S. PATENT DOCUMENTS

| | | |
|---|---|---|
| 5,223,738 | 6/1993 | Okada ............................ 257/670 |
| 5,293,064 | 3/1994 | Yoshimoto et al. ............ 257/670 |
| 5,309,010 | 5/1994 | Shibata et al. ................. 257/670 |
| 5,541,447 | 7/1996 | Maejima et al. ............... 257/669 |
| 5,554,885 | 9/1996 | Yamasaki et al. ............. 257/669 |

FOREIGN PATENT DOCUMENTS

| | | |
|---|---|---|
| 5521128 | 2/1980 | Japan . |
| 6378561 | 4/1988 | Japan . |

Primary Examiner—Mahshid D. Saadat
Assistant Examiner—S. V. Clark
Attorney, Agent, or Firm—Whitham, Curtis & Whitham

[57] ABSTRACT

There is provided a lead frame including an outer frame, a die pad on which a semiconductor device is to be mounted, a plurality of outer leads extending from the outer frame to the die pad, a dam bar connected at opposite ends thereof to the outer frame for connecting the outer leads to one another for prevention of resin overflow, and a support lead extending obliquely to the dam bar for connecting the die pad to the outer frame. The outer frame is formed beyond an end of the dam bar with an opening extending in a direction making an angle with a direction in which the dam bar longitudinally extends so that there is formed an elastically deformable portion between the opening and an end of the dam bar, the opening having a length covering at least a width of the dam bar. When there is generated a stress because of shrinkage of resin with which a semiconductor device is sealed, the elastically deformable portion is first deformed by absorbing a stress to thereby prevent the stress from spreading further to the dam bar. Thus, it is possible to prevent irregular bending of outer leads connected by the dam bar with each other. As a result, higher accuracy is expected with respect to a position of outer leads after a semiconductor device is sealed with resin.

15 Claims, 11 Drawing Sheets

LEAD FRAME FREE OF IRREGULAR DEFORMATION

BACKGROUND OF THE INVENTION

1. Field of the Invention

The invention relates to a lead frame used for fabrication of a semiconductor device to be sealed with resin.

2. Description of the Related Art

One of conventional lead frames used for fabricating a semiconductor device to be sealed with resin is illustrated in FIGS. 1 to 3. As illustrated in FIG. 1, a conventional lead frame 8 includes an outer frame 7, a square die pad 1 on which a semiconductor device (not illustrated) is to be mounted, four support leads 2 one ends of which are connected to corners of the die pad 1 and the other ends to the outer frame 7 to thereby support the die pad 1, a plurality of inner leads 3 extending from the outer frame 7 toward sides of the die pad 1 through a resin-sealed area 9, the same number of outer leads 4 as the number of the inner leads 3, the outer leads 4 being integral with the inner leads 3 and having ends projecting beyond an outer periphery of the resin-sealed area 9, and dam bars 5 connecting the outer leads 4 to one another and surrounding the resin-sealed area 9 for prevention of resin overflow therebeyond when a semiconductor device is sealed with resin.

As illustrated in FIG. 2 in more detail, each of the dam bars 5 extends in parallel with an outer side of the resin-sealed area 9, and is connected at opposite ends thereof to the outer frame 7 in the vicinity of corners of the resin-sealed area 9. As mentioned earlier, the support leads 2 connect the die pad 1 at corners thereof to the lead frame 7 in the vicinity of the corners of the resin-sealed area 9. This means that the support leads 2 extend obliquely to a direction in which the dam bars 5 longitudinally extend.

After the above mentioned lead frame 8 on which a semiconductor device has been already mounted is sealed with resin, the resin-sealed area 9 and the lead frame 8 both receive a shrinkage force directing to a center of the resin-sealed area 9 because of curing shrinkage of resin. This shrinkage force causes a tensile force A directing to the center of the resin-sealed area 9 on the support leads 2, as illustrated in FIG. 3. Similarly, since the support leads 2 are connected to the outer frame 7 at the corners of the resin-sealed area 9, the tensile force A directing to the center of the resin-sealed area 9 acts also on the outer frame 7. Thus, since the dam bars 5 are connected at opposite ends thereof to the outer frame 7 in the vicinity of the corners of the resin-sealed area 9 where the tensile force A acts on the outer frame 7, the dam bars 5 receive a compressive stress B which longitudinally compresses the dam bars 5.

As discussed above, the curing shrinkage of resin generated after a semiconductor device is sealed with resin causes a compressive stress on the dam bars 5 in the above mentioned conventional lead frame 8, resulting in that the outer leads 4 extending perpendicularly to the dam bars 5 will receive bending stresses D1 which bends the outer leads 4 from the bottom toward the top and D2 which bends the outer leads 4 from the right toward the left, as illustrated in FIG. 3. Thus, the outer leads 4 receive not only a tensile force C caused by the curing shrinkage of resin but also the above mentioned bending stresses D1 and D2 transferred through the dam bars 5. As a result, the outer leads 4 tend to be irregularly deformed in the vicinity of where the outer leads 4 are connected to the dam bars 5, as illustrated with broken lines in FIG. 3. Accordingly, an accuracy regarding a position of the outer leads 4 is deteriorated after a semiconductor device is sealed with resin, which resultingly causes the dam bars 5 to be inaccurately cut in subsequent processes, and also causes inaccurate lead bending in a lead forming process.

In order to prevent irregular deformation of a lead frame caused by resin shrinkage after a semiconductor device is sealed with resin, Japanese Unexamined Patent Publication No. 63-78561 has suggested an improvement in a lead frame structure. The suggested lead frame includes a side frame formed with a plurality of slits, between which there are formed easily breakable portions or reduced width portions. However, the suggested lead frame merely distributes shrinkage of a lead frame, which is effective against a stress perpendicularly acting on a dam bar, but which is not effective at all against a stress longitudinally acting on a dam bar which stress causes outer leads to be bent as mentioned earlier.

Another example of forming a lead frame with a silt is found in Japanese Unexamined Patent Publication No. 55-21128. This Publication has suggested a support lead 2 having a proximal end bifurcated into two portions 2a and 2b, as illustrated in FIG. 4. However, these two portions 2a and 2b are covered with resin in a step of sealing a semiconductor device with resin. Thus, in the end, the shrinkage force of resin is directly transferred to dam bars 15 through the bifurcated portions 2a and 2b, and hence, irregular deformation of the dam bars 15 and leads 14 are not avoidable.

SUMMARY OF THE INVENTION

In view of the foregoing problems of prior lead frames, it is an object of the present invention to provide a lead frame free of irregular deformation of outer leads caused by curing shrinkage of resin after a semiconductor device is sealed with resin.

There is provided a lead frame including an outer frame, a die pad on which a semiconductor device is to be mounted, a plurality of outer leads extending from the outer frame to the die pad, a dam bar connected at opposite ends thereof to the outer frame for connecting the outer leads to one another for prevention of resin overflow, and a support lead extending obliquely to the dam bar for connecting the die pad to the outer frame. The outer frame is formed beyond an end of the dam bar with an elastically deformable portion so that when the dam bar receives a stress, the elastically deformable portion is first deformed and the dam bar remains non-deformed. As an alternative, the outer frame may be formed beyond an end of the dam bar with an opening extending in a direction making an angle, preferably 90 degrees, with a direction in which the dam bar longitudinally extends so that there is formed an elastically deformable portion between the opening and an end of the dam bar, the opening having a length covering at least a width of the dam bar.

There is further provided a lead frame including an outer frame, a die pad on which a semiconductor device is to be mounted, a plurality of outer leads extending from the outer frame to the die pad, dam bars connected at opposite ends thereof to the outer frame for connecting the outer leads to one another for prevention of resin overflow, and a support lead extending obliquely to the dam bars for connecting the die pad to the outer frame, ends of two dam bars among the dam bars being disposed at either sides of an end of the support lead. The outer frame is formed beyond ends of the two dam bars with elastically deformable portions so that when the two dam bars receive a stress, the elastically deformable portions are first deformed and the two dam bars remain non-deformed. As an alternative, the outer frame may be formed beyond ends of two dam bars among the dam bars with a single opening having portions extending in directions making angles with directions in which the two dam bars longitudinally extend so that there are formed two elastically deformable portions between the single opening and ends of two the dam bars, the portions each having a length covering at least a width of each of the two dam bars.

In accordance with the present invention, a lead frame is formed with an elastically deformable portion(s) between a dam bar(s) and an outer frame, for instance, by forming an opening in the vicinity of an end or ends of the dam bar(s). Hence, when there is produced a stress caused by resin shrinkage after a semiconductor device is sealed with resin, the elastically deformable portion(s) is(are) first elastically deformed to thereby absorb or relief a stress transferred from the outer frame to the dam bar(s). Thus, it is possible to avoid irregular deformation of the outer leads, thereby resultingly ensuring high positional accuracy of the outer leads after a semiconductor device is sealed with resin. Accordingly, it is avoidable to inaccurately cut the dam bars in subsequent processes and cause the outer leads to be irregularly bent in a lead forming process.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 5:
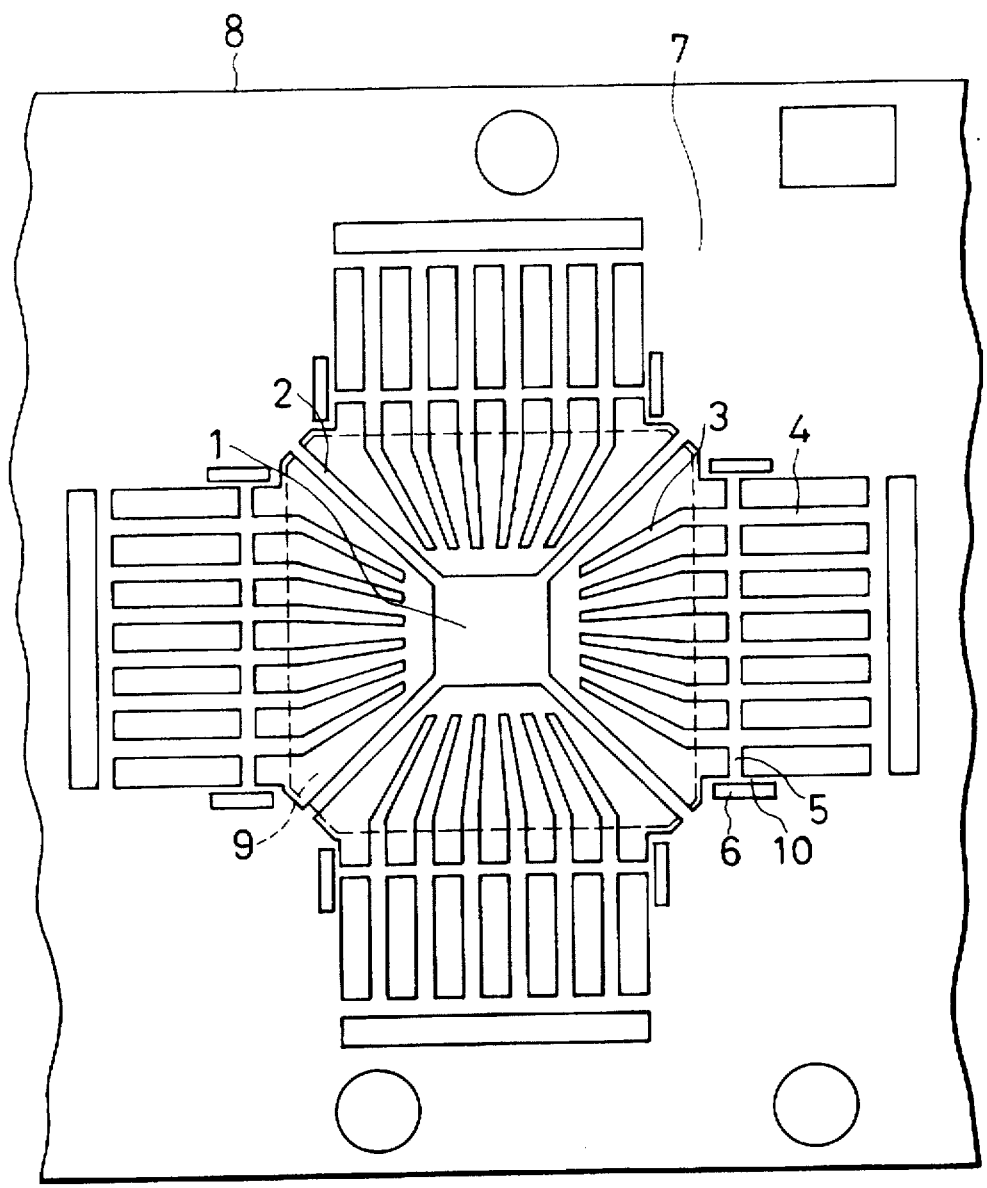
FIG. 5 is a plan view illustrating a lead frame made in accordance with the first embodiment of the present invention.
Figure 6:
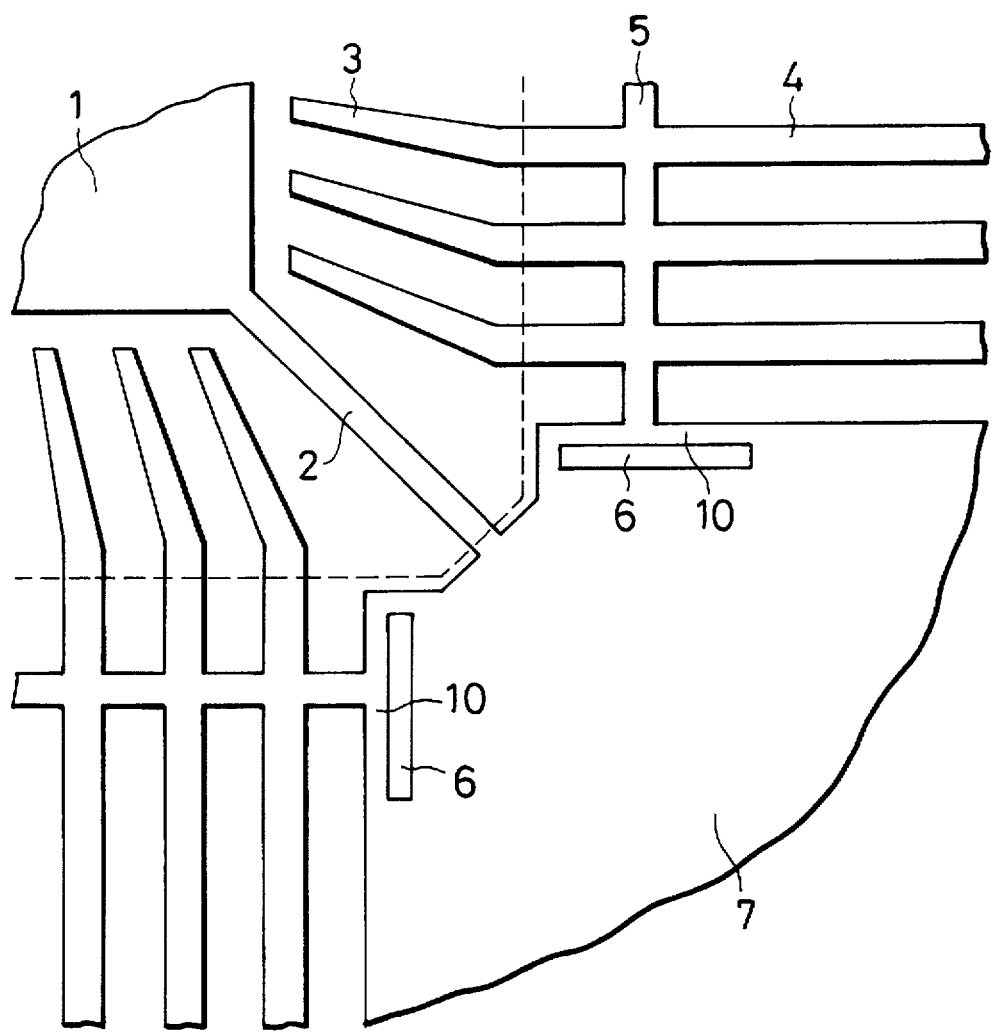
FIG. 6 is a partially enlarged view illustrating a region around ends of dam bars of the lead frame illustrated in FIG. 5.
Figure 7:
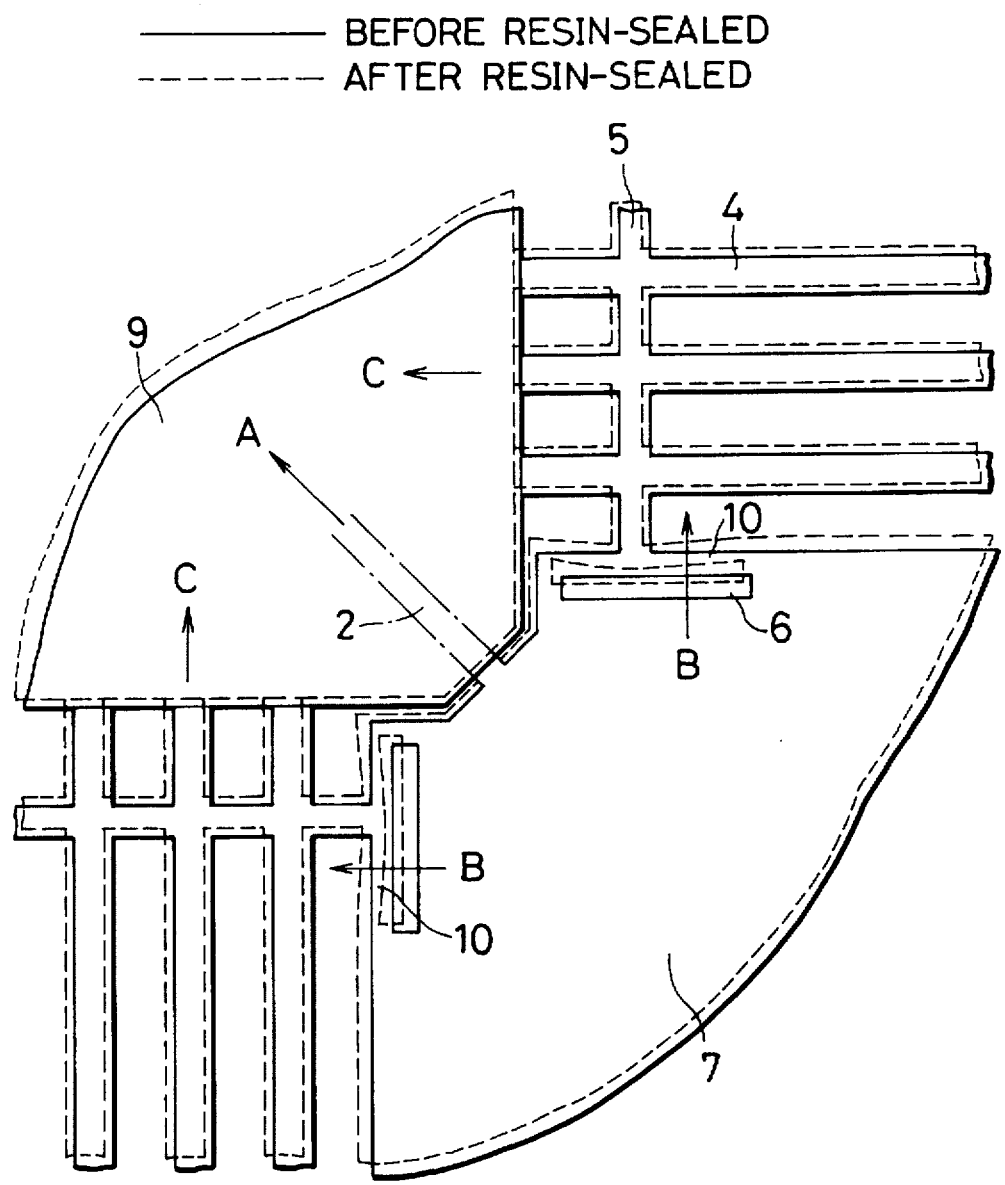
FIG. 7 is a partially enlarged view similar to FIG. 6, illustrating a region around ends of dam bars before and after a semiconductor device is sealed with resin.

A lead frame made in accordance with the first embodiment is illustrated in FIGS. 5 to 7. As illustrated in FIG. 5, a lead frame 8 includes an outer frame 7, a square die pad 1 on which a semiconductor device (not illustrated) is to be mounted, four support leads 2 one ends of which are connected to corners of the die pad 1 and the other ends to the outer frame 7 to thereby support the die pad 1, a plurality of inner leads 3 extending toward sides of the die pad 1 through a resin-sealed area 9, the same number of outer leads 4 as the number of the inner leads 3, the outer leads 4 being integral with the inner leads 3 and having ends projecting beyond an outer periphery of the resin-sealed area 9, and dam bars 5 connecting the outer leads 4 to one another and surrounding the resin-sealed area 9 for prevention of resin overflow therebeyond when a semiconductor device is sealed with resin.

Each of the dam bars 5 extends in parallel with an outer side of the resin-sealed area 9, and is connected at opposite ends thereof to the outer frame 7 in the vicinity of corners of the resin-sealed area 9. Since the support leads 2 connect the die pad 1 at corners thereof to the lead frame 7 in the vicinity of the corners of the resin-sealed area 9, the support leads 2 extend obliquely to a direction in which the dam bars 5 longitudinally extend.

As illustrated in FIG. 6 in more detail, the lead frame 7 is formed in the vicinity of ends of the dam bars 5 with elongate rectangular slits 6 extending perpendicularly to a direction in which the dam bars 5 longitudinally extend. In this embodiment, each of the slits 6 has a length about six times greater than a width of the dam bars 5. However, it should be note that a length of the slits 6 is not to be limited to the above mentioned length, and that the slit 6 may have any length unless the length is greater than a width of the dam bars 5. A preferable length of the slits 6 is about ten times greater than a width of the dam bars 5. The slits 6 are required to entirely cover a width of the dam bars 5. Even if the slits 6 have a length greater than a width of the dam bars, it is not allowed for the slits 6 to partially cover a width of the dam bars 5.

The formation of the slits 6 provides the outer frame 7 with portions 10 located between the ends of the dam bars 5 and the slits 6 and extending perpendicularly to a direction in which the dam bars 5 longitudinally extend. Since the slits 6 entirely covers a width of the dam bars 5, the portions 10 also entirely cover a width of the dam bars 5. As discussed below in detail, the portions 10 are first elastically deformed when the dam bars 5 receive a stress (therefore, the portions 10 are referred to as "the elastically deformable portions 10" hereinafter).

Figure 1:
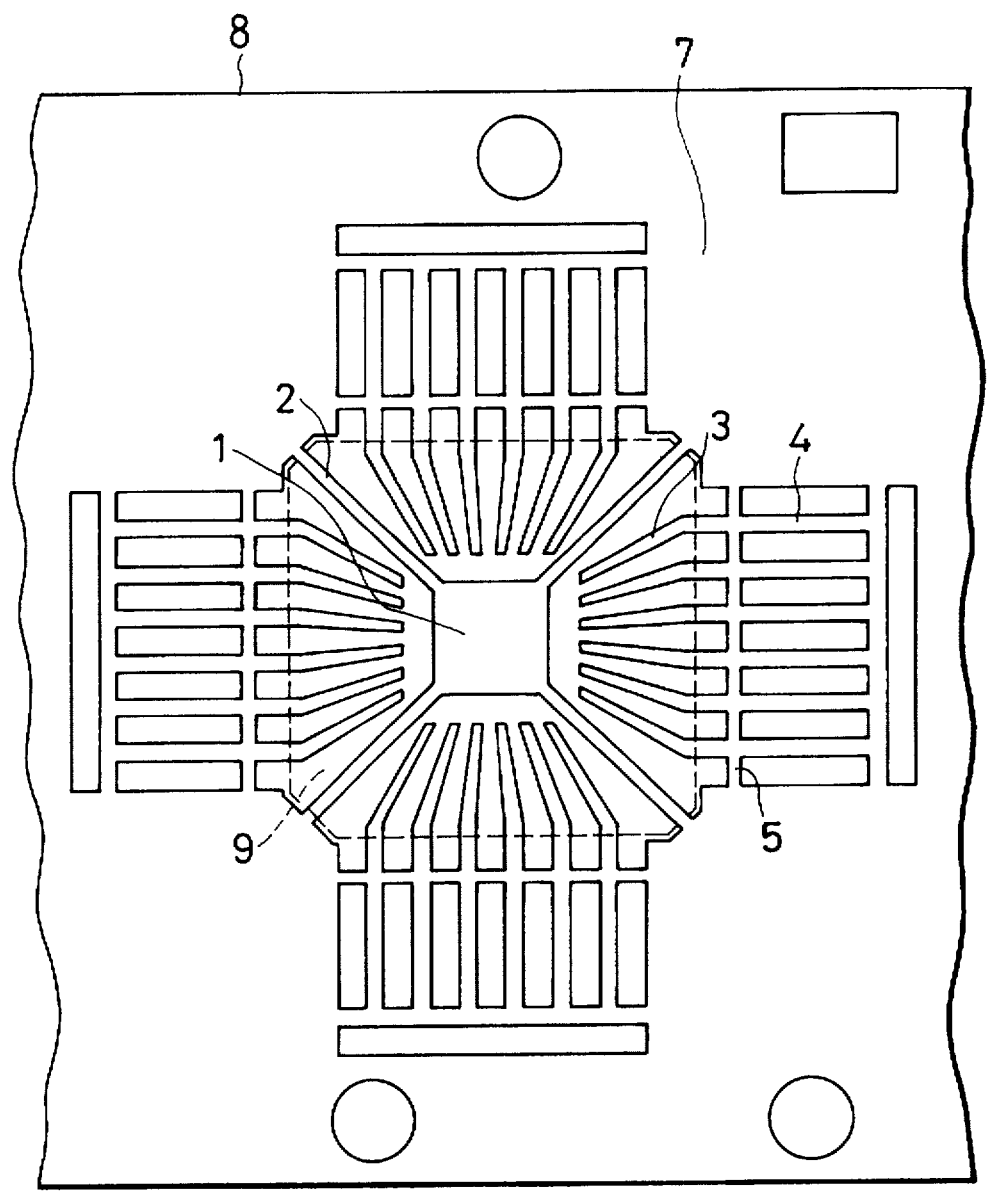
FIG. 1 is a plan view illustrating a conventional lead frame.
Figure 2:
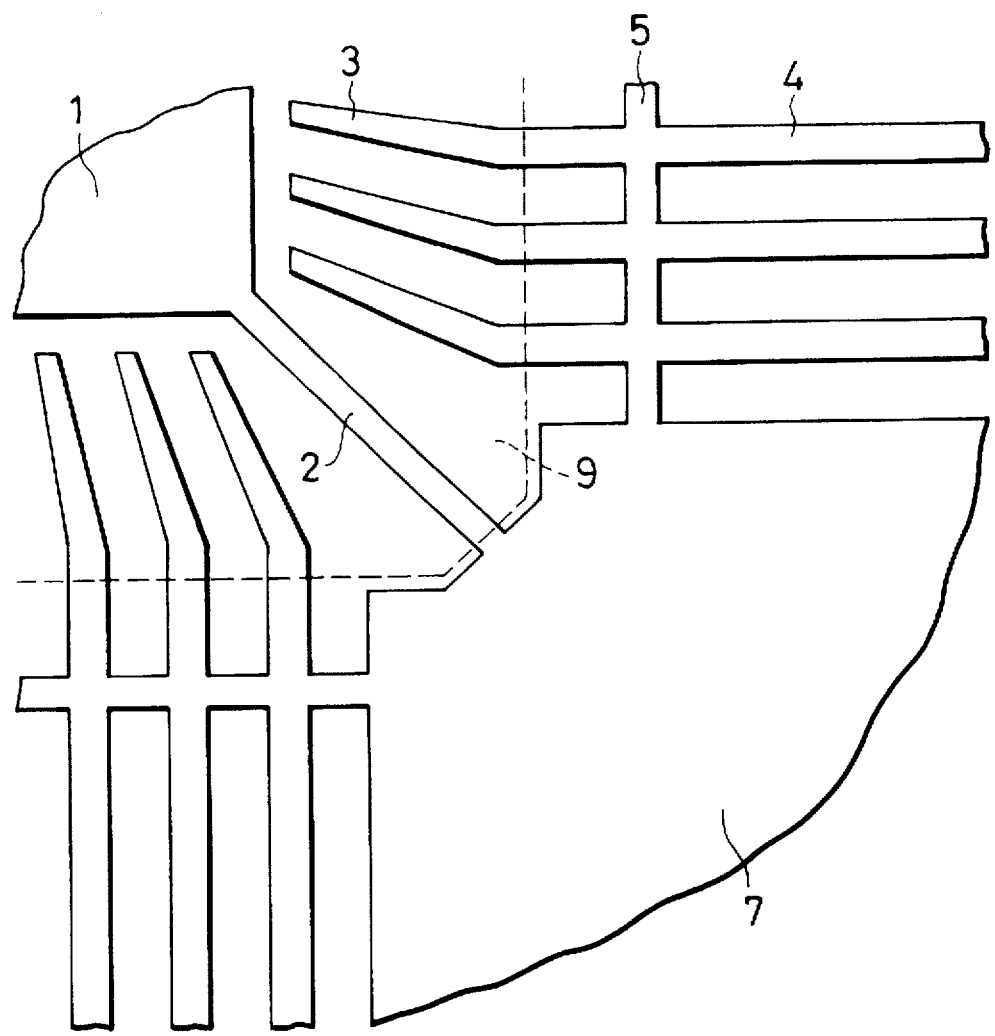
FIG. 2 is a partially enlarged view illustrating a region around ends of dam bars of the lead frame illustrated in FIG. 1.
Figure 3:
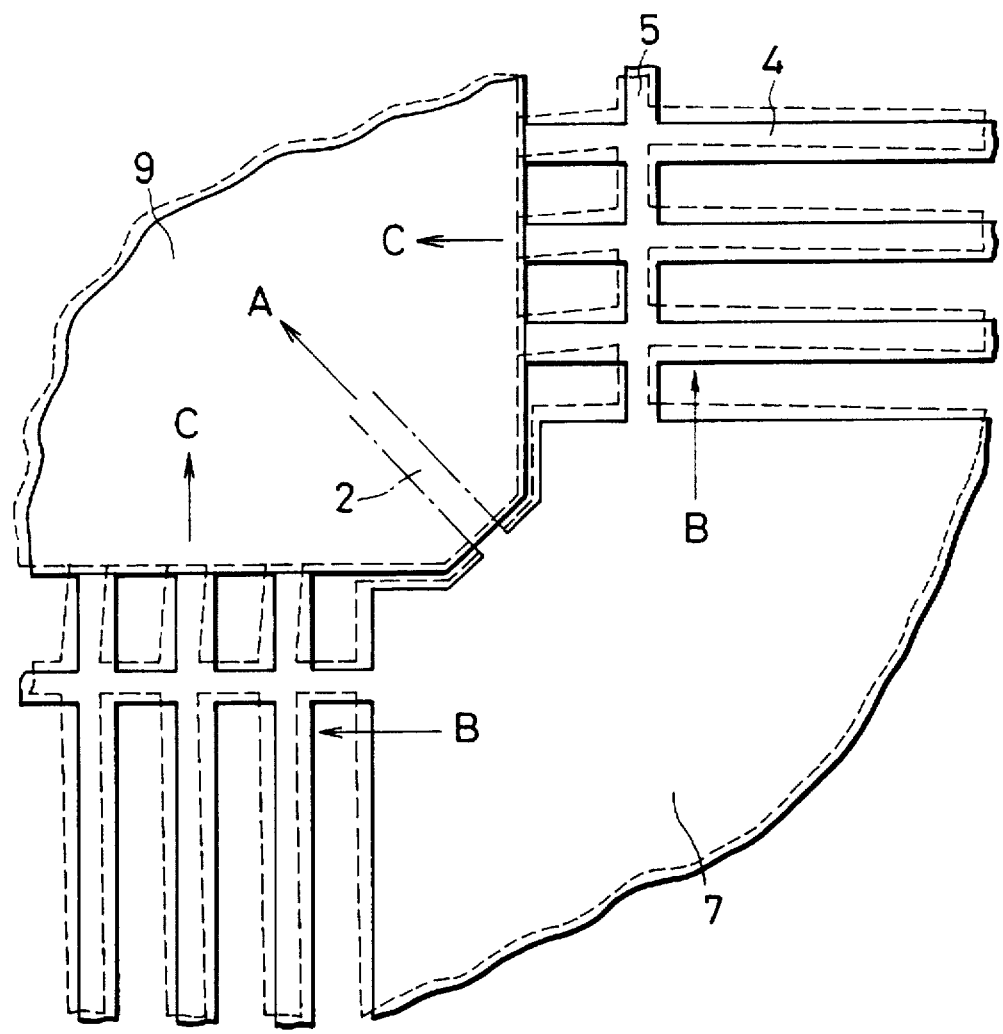
FIG. 3 is a partially enlarged view similar to FIG. 2, illustrating a region around ends of dam bars before and after a semiconductor device is sealed with resin.
Figure 4:
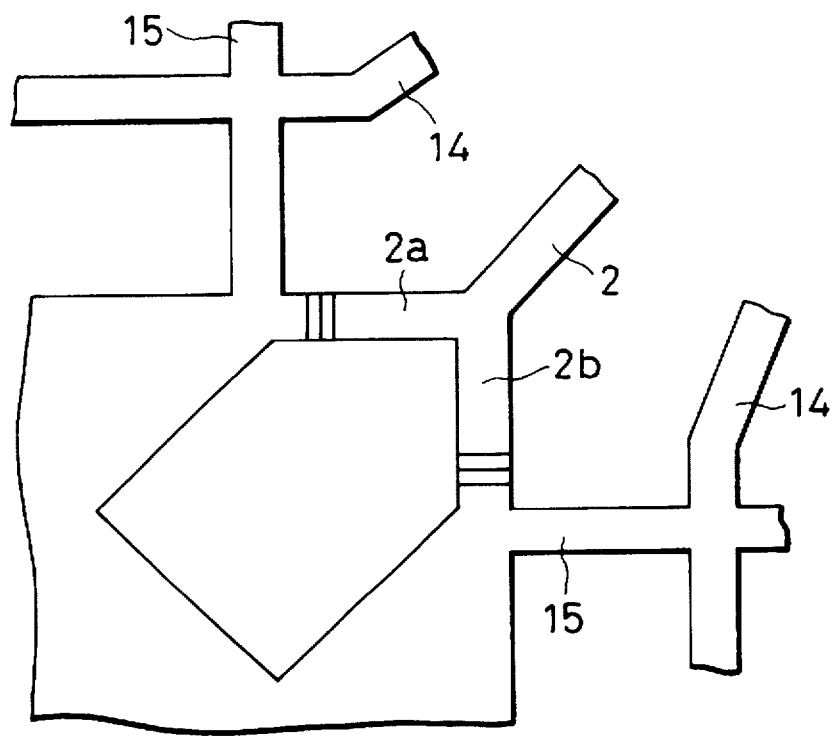
FIG. 4 is a partially enlarged view illustrating a region around an end of a dam bar in another conventional lead frame.

After the lead frame 8 having a semiconductor device having been already mounted on the die pad 1 is sealed with resin, the resin-sealed area 9 and the lead frame 8 both receive a shrinkage force directing to a center of the resin-sealed area 9 because of the curing shrinkage of resin. This shrinkage force causes a tensile force A directing to the center of the resin-sealed area 9 on the support leads 2, as illustrated in FIG. 3. Similarly, since the support leads 2 are connected to the outer frame 7 at the corners of the resin-sealed area 9, the tensile force A directing to the center of the resin-sealed area 9 acts also on the outer frame 7. Thus, since the dam bars 5 are connected at opposite ends thereof to the outer frame 7 in the vicinity of the corners of the resin-sealed area 9 where the tensile force A acts on the outer frame 7, the dam bars 5 receive a compressive stress B which longitudinally compresses the dam bars 5. Herein, the compressive force B is a component of the tensile force A obtained by decomposing the tensile force A along a Y-axis or a vertical line. Namely, the lead frame 8 receives the above mentioned stresses similarly to the conventional lead frame illustrated in FIG. 1.

In the first embodiment, the outer frame 7 is formed in the vicinity of the dam bars 5 with the slits 6, so that the dam bars 7 are not directly connected to the outer frame 7, namely, separated from the outer frame through the slits 6. That is, the dam bars 5 are connected to the outer frame 7 through the elastically deformable portions 10. The elastically deformable portions 10 are weaker in strength than the dam bars 5 and the outer frame 7. Hence, as illustrated in FIG. 7 with a broken line, when the tensile force A acting on the support leads 2 is going to be transferred to the dam bars 5, the elastically deformable portions 10 are first elastically deformed to thereby absorb or relief a compressive stress which would compress the dam bars 5, resulting in that no compressive stress is transferred to the dam bars 5. Thus, unlike the above mentioned conventional lead frame, as the outer leads 4 do not receive a force which would bend the outer leads 4, the outer leads 4 are not irregularly deformed with the result that the outer leads 4 are kept in position even after a semiconductor device is sealed with resin. As illustrated in FIG. 7, though the outer leads 4 may be moved to a position shown with a broken line, it can be seen that the outer leads 4 keep their original shape without being irregularly deformed.

In the first embodiment, the silts 6 are formed rectangular. Since a mold for forming the slits 6 rectangular can be readily fabricated, the lead frame 8 in accordance with the first embodiment can be readily fabricated with lower costs.

The slits 6 may be designed to have any shapes other than a rectangle unless there are formed the elastically deformable portions 10 between the slits and the dam bars 5.

Figure 8:
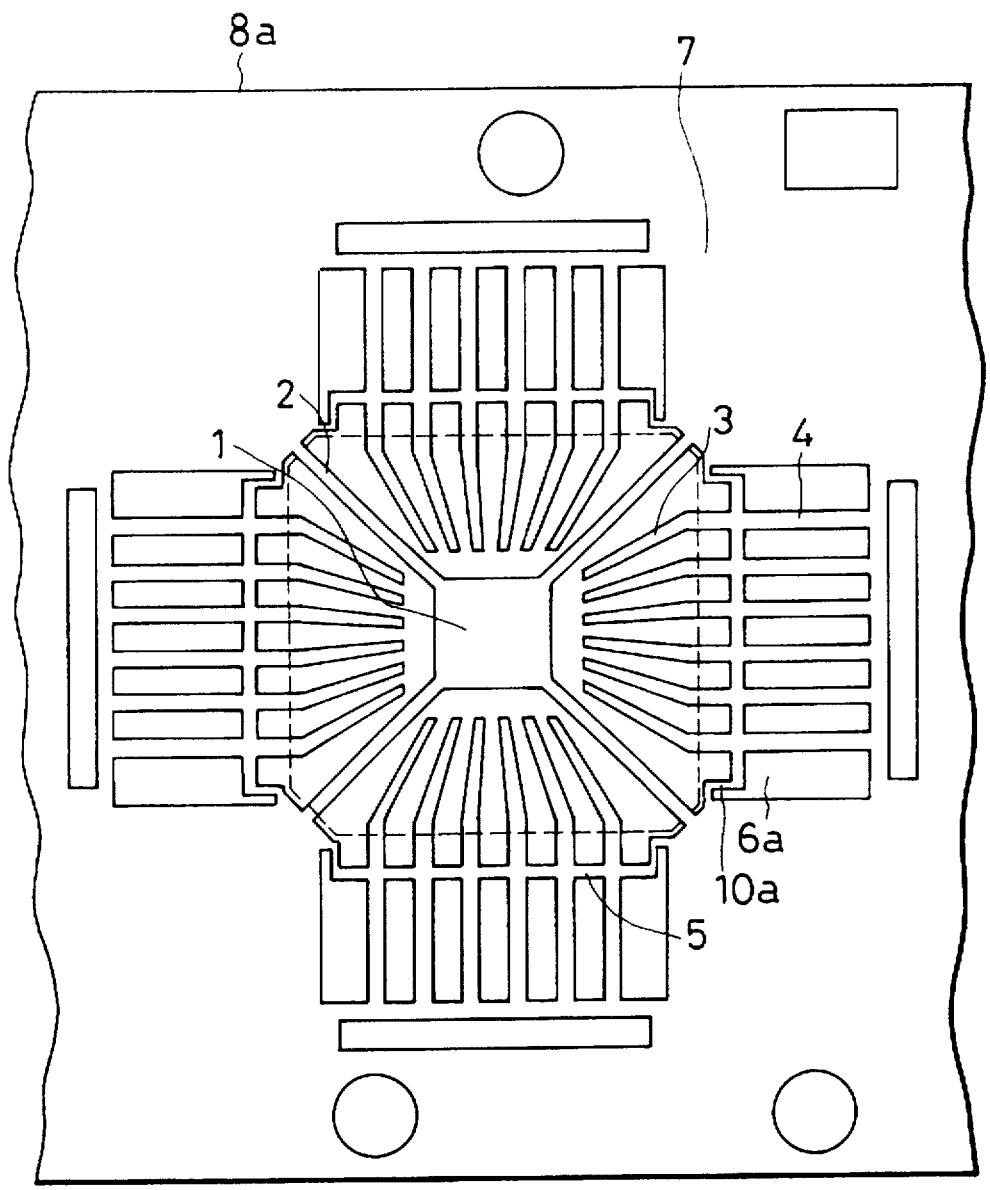
FIG. 8 is a plan view illustrating a lead frame made in accordance with the second embodiment of the present invention.
Figure 9:
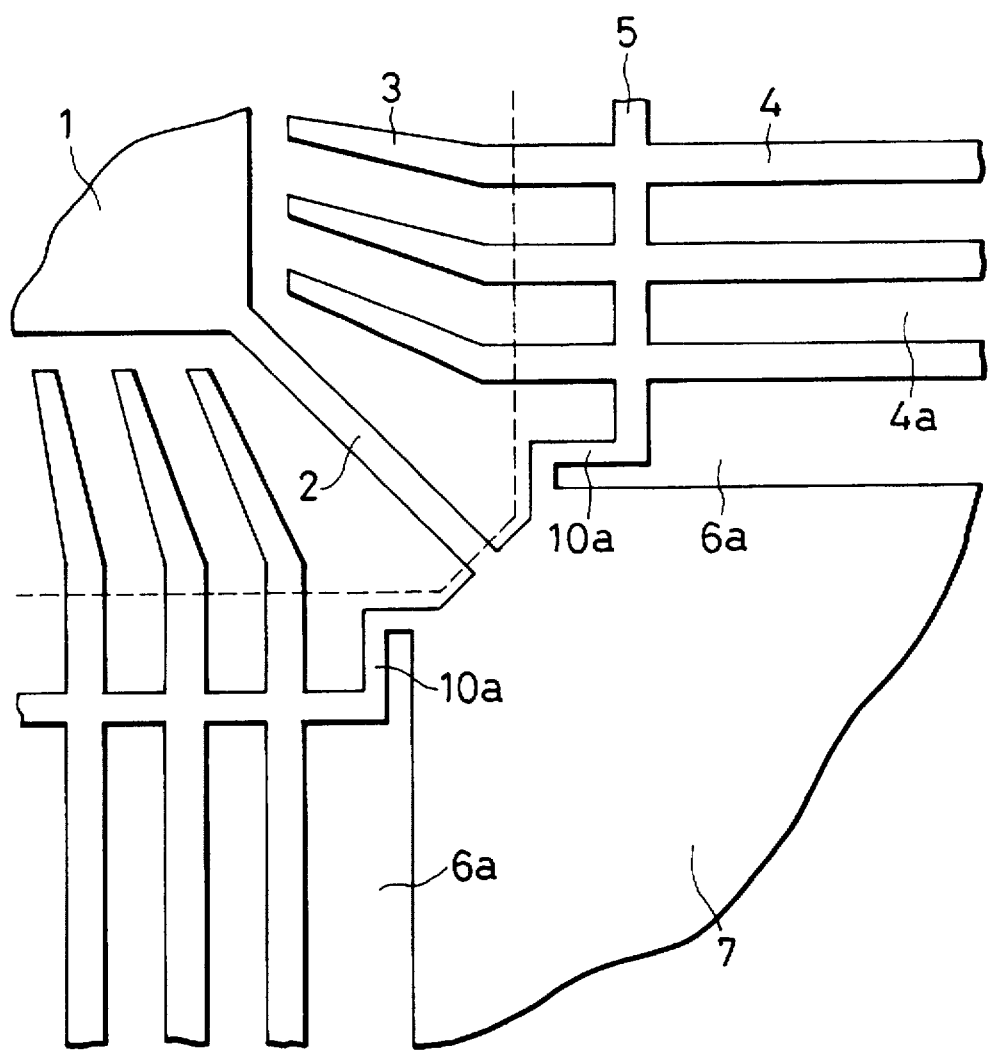
FIG. 9 is a partially enlarged view illustrating a region around ends of dam bars of the lead frame illustrated in FIG. 8.
Figure 10:
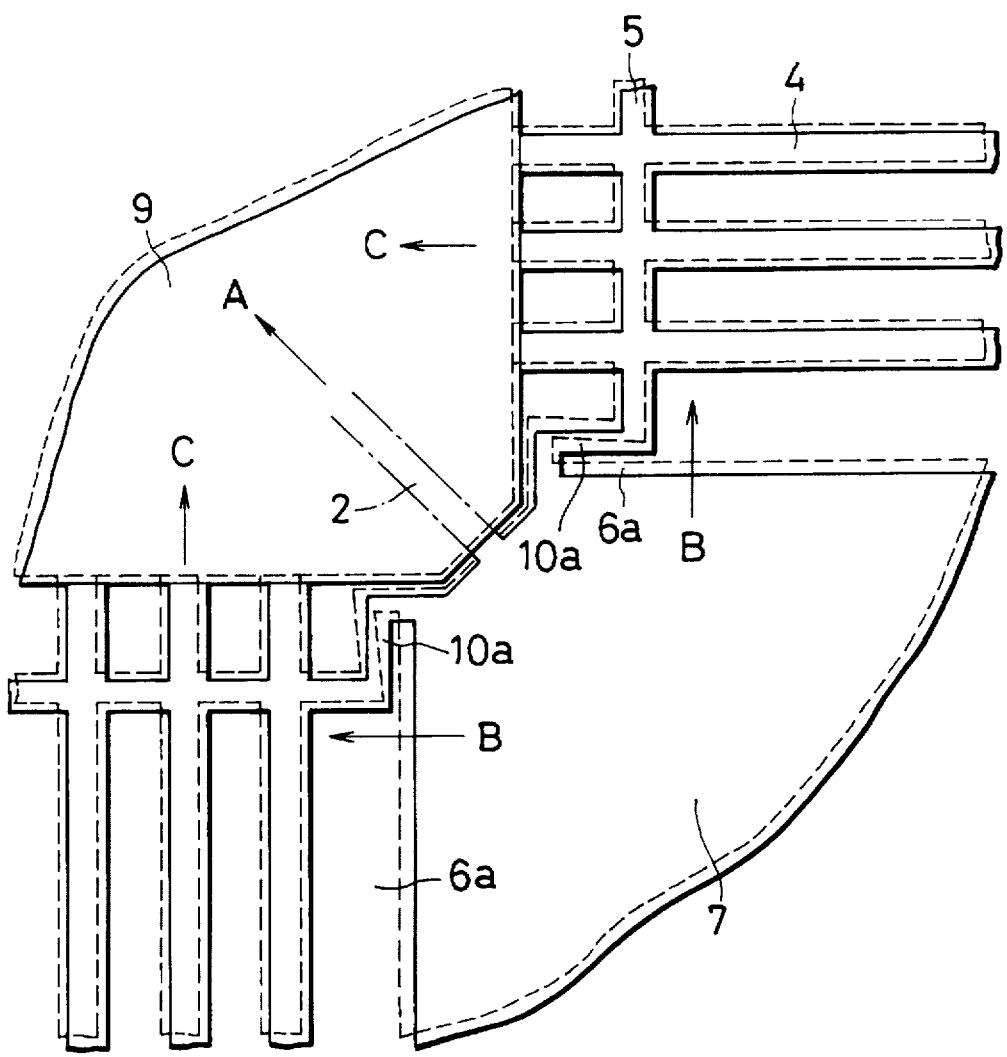
FIG. 10 is a partially enlarged view similar to FIG. 9, illustrating a region around ends of dam bars before and after a semiconductor device is sealed with resin.

With reference to FIGS. 8 to 10, a lead frame 8a made in accordance with the second embodiment of the present invention is described hereinbelow. Elements or parts corresponding to those of the first embodiment illustrated in FIGS. 5 to 7 have been provided with the same reference numerals, and thus will not be explained in detail. The second embodiment is different from the first embodiment in that there is formed an opening 6a in place of the elongate rectangular slits 6. Specifically, a slit in the second embodiment is continuous with a gap 4a formed between the outer leads 4 to thereby form the opening 6a having a shape as illustrated in FIGS. 8 and 9. As a result, elastically deformable portions 10a in the second embodiment are crank-shaped.

In the lead frame 8a made in accordance with the second embodiment, similarly to the first embodiment, the tensile force A directing to the center of the resin-sealed area 9 acts on the support leads 2 because of curing shrinkage of resin after a semiconductor device has been sealed with resin, and the compressive stress B acts on the dam bars 5. Similarly to the elastically deformable portions 10 in the first embodiment, the elastically deformable portions 10a in the second embodiment are elastically deformed to thereby absorb or relief the stress which are going to act on the dam bars 5, resulting in that it is avoidable that the dam bars 5 are irregularly deformed. The crank-shaped elastically deformable portions 10a are weaker in strength than the line-shaped elastically deformable portions 10 of the first embodiment. Hence, the crank-shaped elastically deformable portions 10a are deformed to greater degree than the elastically deformable portions 10 in the first embodiment. Thus, the lead frame 8a made in accordance with the second embodiment provides greater effects of absorbing or relieving the compressive stress acting on the dam bars 5 than those of the first embodiment.

Figure 11:
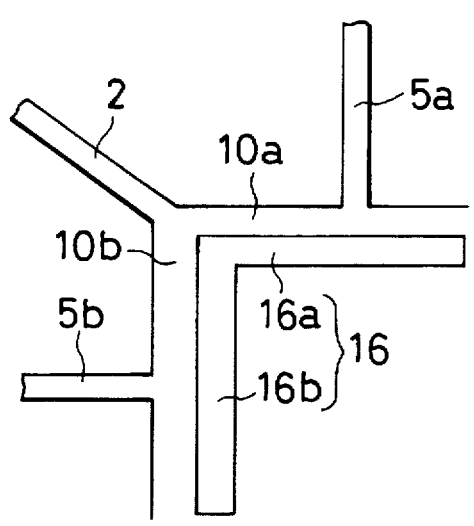
FIG. 11 is a partially enlarged view illustrating a lead frame made in accordance with the third embodiment of the present invention.

FIG. 11 partially illustrates a lead frame made in accordance with the third embodiment of the present invention. The above mentioned lead frames 8 and 8a made in accordance with the first and second embodiments have the two slits 6 or openings 6a so that the support lead 2 is located intermediate between the slits 6 or openings 6a and each of the slits 6 or openings 6a is located in the close vicinity of the end of the dam bar 5. In the third embodiment and a later mentioned fourth embodiment, there is formed only a single opening to thereby provide elastically deformable portions at ends of two dam bars extending perpendicularly to each other.

As illustrated in FIG. 11, an outer frame of a lead frame made in accordance with the third embodiment is formed with a L-shaped slit 16 having portions 16a and 16b extending perpendicularly to directions in which dam bars 5a and 5b longitudinally extend. The formation of the L-shaped slit 16 results in the formation of elastically deformable portions 10a and 10b between the portions 16a and 16b of the slit 16 and ends of the dam bars 5a and 5b. Similarly to the slit 6 in the first embodiment, a length of the portions 16a and 16b entirely cover a width of the dam bars 5a and 5b, respectively.

In accordance with the third embodiment, the formation of the single opening 16 ensures the formation of the two elastically deformable portions 10a and 10b in the close vicinity of the ends of the two dam bars 5 extending perpendicularly to each other. Since the formation of a single opening is more readily accomplished than the formation of two openings, the lead frame in accordance with the third embodiment can be more readily fabricated than the lead frames in accordance with the first and second embodiments. In addition, since the single opening 16 has a larger area than a sum of areas of the two slits 6 in the first embodiment, the elastically deformable portions 10a and 10b in the third embodiment are weaker in strength than the elastically deformable portions 10 in the first embodiment, resulting in that the third embodiment provides greater effect of absorbing or relieving a compressive stress going to act on dam bars.

Figure 12:
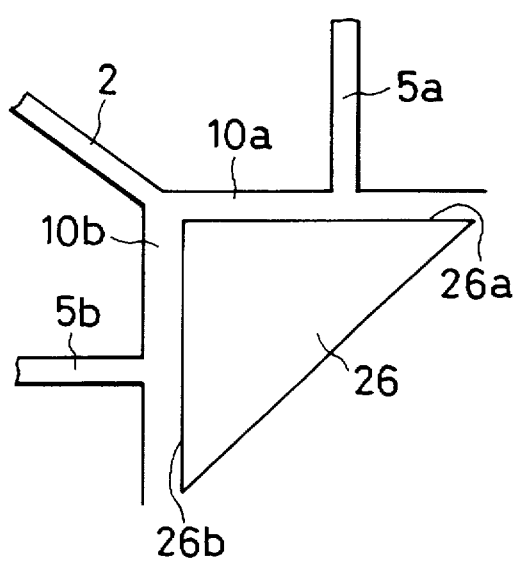
FIG. 12 is a partially enlarged view illustrating a lead frame made in accordance with the fourth embodiment of the present invention.

FIG. 12 partially illustrates a lead frame made in accordance with the fourth embodiment of the present invention. As illustrated in FIG. 12, an outer frame of a lead frame made in accordance with the fourth embodiment is formed with a triangular opening 26 having sides 26a and 26b extending perpendicularly to directions in which dam bars 5a and 5b longitudinally extend. The formation of the triangular opening 26 results in the formation of elastically deformable portions 10a and 10b between the sides 26a and 26b of the triangular opening 26 and ends of the dam bars 5a and 5b. Similarly to the slit 6 in the first embodiment, a length of the sides 26a and 26b entirely cover a width of the dam bars 5a and 5b, respectively.

The triangular opening 26 provides the same advantageous effects as those of the third embodiment illustrated in FIG. 11.

It should be noted that a shape of a slit or opening is not to be limited to a L-shape or triangle as shown in FIGS. 11 and 12, and that a slit or opening may be designed to have any other shapes unless there are formed elastically deformable portions between the slit or opening and ends of the dam bars. For instance, a slit or opening may be designed to be rectangular or semicircular in shape.

In the above mentioned first to fourth embodiment, the elastically deformable portions 10, 10a and 10b extend perpendicularly to a direction in which the dam bars 5, 5a and 5b longitudinally extend. In other words, the elastically deformable portions 10, 10a and 10b make 90 degrees with the dam bars 5, 5a and 5b. However, it should be noted that an angle which the elastically deformable portions 10, 10a and 10b make with the dam bars 5, 5a and 5b is not to be limited to 90 degrees, but may be any angle unless the elastically deformable portions 10, 10a and 10b can absorb a stress going to act on the dam bars 5, 5a and 5b.

As mentioned earlier, it is preferable for the elastically deformable portions 10, 10a and 10b to have a greater length relative to a width of the dam bars 5, 5a and 5b. However, the length of the elastically deformable portions 10, 10a and 10b has to entirely cover a width of the dam bars 5, 5a and 5b.

It should be noted that the present invention may be applied to any lead frames other than the first to fourth embodiments, if it includes a dam bar(s) extending obliquely to a support lead(s).

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 7-208915 filed on Aug. 16, 1995 including specification, claims, drawings and summary is incorporated herein by reference in its entirety.

What is claimed is:

1. A lead frame comprising:
   an outer frame;
   a die pad on which a semiconductor device is to be mounted;
   a plurality of outer leads extending from said outer frame to said die pad;
   a dam bar connected at opposite ends thereof to said outer frame for connecting said outer leads to one another for prevention of resin overflow; and
   a support lead extending obliquely to said dam bar for connecting said die pad to said outer frame,
   said outer frame being formed beyond an end of said dam bar with an elastically deformable portion so that said dam bar is not directly connected to said support lead and so that when said dam bar receives a stress, only said elastically deformable portion is first deformed and both said dam bar and said outer leads remain non-deformed.

2. A lead frame comprising:
   an outer frame;
   a die pad on which a semiconductor device is to be mounted;
   a plurality of outer leads extending from said outer frame to said die pad;
   a dam bar connected at opposite ends thereof to said outer frame for connecting said outer leads to one another for prevention of resin overflow; and
   a support lead extending obliquely to said dam bar for connecting said die pad to said outer frame,
   said outer frame being formed beyond an end of said dam bar with an opening extending in a direction making an angle with a direction in which said dam bar longitudinally extends so that there is formed an elastically deformable portion between said opening and an end of said dam bar, said opening having a length covering at least a width of said dam bar.

3. The lead frame as set forth in claim 2, wherein said angle is 90 degrees.

4. The lead frame as set forth in claim 2, wherein said opening is in the form of an elongate, rectangular slit, so that said elastically deformable portion is in the form of a line.

5. The lead frame as set forth in claim 2, wherein said opening has a length about ten times longer than a width of said dam bar.

6. The lead frame as set forth in claim 3, wherein said opening is in the form of an elongate, rectangular slit, so that said elastically deformable portion is in the form of a line.

7. The lead frame as set forth in claim 3, wherein said opening has a length about ten times longer than a width of said dam bar.

8. The lead frame as set forth in claim 2, wherein said opening is continuous with a gap formed between said outer leads so that said elastically deformable portion is crank-shaped.

9. The lead frame as set forth in claim 3, wherein said opening is continuous with a gap formed between said outer leads so that said elastically deformable portion is crank-shaped.

10. A lead frame comprising:
    an outer frame;
    a die pad on which a semiconductor device is to be mounted;
    a plurality of outer leads extending from said outer frame to said die pad;
    dam bars connected at opposite ends thereof to said outer frame for connecting said outer leads to one another for prevention of resin overflow; and
    a support lead extending obliquely to said dam bars for connecting said die pad to said outer frame, ends of two dam bars among said dam bars being disposed at either sides of an end of said support lead,
    said outer frame being formed beyond ends of said two dam bars with elastically deformable portions so that said dam bar is not directly connected to said support lead and so that when said two dam bars receive a stress, only said elastically deformable portions are first deformed and both said two dam bars and said outer leads remain non-deformed.

11. A lead frame comprising:
    an outer frame;
    a die pad on which a semiconductor device is to be mounted;
    a plurality of outer leads extending from said outer frame to said die pad;
    dam bars connected at opposite ends thereof to said outer frame for connecting said outer leads to one another for prevention of resin overflow; and
    a support lead extending obliquely to said dam bars for connecting said die pad to said outer frame,
    said outer frame being formed beyond ends of two dam bars among said dam bars with a single opening having portions extending in directions making angles with directions in which said two dam bars longitudinally extend so that there are formed two elastically deformable portions between said single opening and ends of two said dam bars, said portions each having a length covering at least a width of each of said two dam bars.

12. The lead frame as set forth in claim 11, wherein said opening is reverse L-shaped so that each of two sides faces an end of each of said two dam bars.

13. The lead frame as set forth in claim 12, wherein said each of two sides extends perpendicularly to a direction in which each of said two dam bares extend.

14. The lead frame as set forth in claim 11, wherein said opening is triangular in shape so that each of two out of three sides faces an end of each of said two dam bars.

15. The lead frame as set forth in claim 14, wherein said each of two out of three sides extends perpendicularly to a direction in which each of said two dam bares extend.

* * * * *